United States Patent [19]

Min et al.

[11] Patent Number: 5,281,551
[45] Date of Patent: Jan. 25, 1994

[54] METHOD FOR DELTA-DOPING IN GAAS EPITAXIAL LAYER GROWN ON SILICON SUBSTRATE BY METALORGANIC CHEMICAL VAPOR DEPOSITION

[75] Inventors: Suk-ki Min; Yong Kim; Moo S. Kim, all of Seoul, Rep. of Korea

[73] Assignee: Korea Institute of Science and Technology, Seoul, Rep. of Korea

[21] Appl. No.: 909,935

[22] Filed: Jul. 7, 1992

[30] Foreign Application Priority Data

Jul. 8, 1991 [KR] Rep. of Korea ............... 11523/1991

[51] Int. Cl.$^5$ ............................................. H01L 21/20
[52] U.S. Cl. .................................... 437/126; 437/132; 437/133
[58] Field of Search ............... 437/126, 132, 133, 107, 437/106; 156/613, 614

[56] References Cited

U.S. PATENT DOCUMENTS

| | | | |
|---|---|---|---|
| 4,716,130 | 12/1987 | Johnston, Jr. et al. | 156/614 |
| 5,153,147 | 10/1992 | Karlick, Jr. | 156/613 |
| 5,168,077 | 12/1992 | Ashizawa et al. | 437/107 |
| 5,169,798 | 12/1992 | Eaglesham et al. | 437/106 |

OTHER PUBLICATIONS

Parker in "The Physics and Technology of Molecular Beam Epitaxy" Plenum press (1985), pp. 428–434.
Schubert, "Delta Doping of III-V Compound Semiconductors: Fundamentals and Device Applications," J. Vac. Sci. Tech., May/Jun. 1990, pp. 2980–2996.

*Primary Examiner*—Robert Kunemund
*Assistant Examiner*—Ramamohan Rao Paladugu
*Attorney, Agent, or Firm*—Lowe, Price, LeBlanc & Becker

[57] ABSTRACT

The technique of the delta-doping by metalorganic chemical vapor deposition (MOCVD) in GaAs epitaxial layer at 700°–750° C. after deposition of GaAs heteroepitaxial buffer layer exceeding 3 μm thickness on silicon substrate.

1 Claim, 2 Drawing Sheets

METHOD FOR DELTA-DOPING IN GAAS EPITAXIAL LAYER GROWN ON SILICON SUBSTRATE BY METALORGANIC CHEMICAL VAPOR DEPOSITION

BACKGROUND OF THE INVENTION

The present invention relates to a method for realizing the delta-doping, with practical quality, in GaAs epitaxial layer grown on silicon substrate by metalorganic chemical vapor deposition (MOCVD).

Recently, heteroepitaxial technology concerned with the growth of GaAs on Si substrate, has been paid much attention. This is due to a few advantages of silicon substrate over GaAs substrate. Silicon substrate has sufficient mechanical hardness and high thermal conductivity. Large-area substrates with low defect density can be readily prepared with the present technology. In addition, silicon substrate is cheaper than GaAs substrate.

Specifically, the large-area availability enables the realization of tandem GaAs solar cells on Si. Moreover, mass production of cost-effective GaAs field effect transistors (FETs) on Si is also possible. Recently, a monolithic integrated circuit combining the Si memory devices and GaAs optoelectronic devices was suggested.

However, the problems arising from dissimilar properties between both materials are the major obstacles to prepare GaAs epitaxial layer on silicon substrate with acceptable quality. Many dislocations are inevitably involved in the GaAs epitaxial layer due to the relatively large lattice mismatch and thermal expansion coefficient difference of both materials. The dislocations are generated from GaAs/Si heterointerface and threaded to GaAs surface. Antiphase domain brought from the inherent problem when epitaxial growing of polar material (GaAs) on non-polar material (Si) in another problem.

A 2-step growth technique using a slightly tilted (100) silicon substrate has proven to be a successful way to grow high quality GaAs layer on Si. However, there still remains many dislocations with density of $10^6$–$10^8$ cm$^{-2}$ near GaAs surface. For commercial GaAs devices on Si, much studies should be done.

Meanwhile, delta-doping concept which is a 2-dimensional doping concept has been recently emerged [E. F. Schubert, J. Vac. Technol. A8, 2980 (1990)]. This concept is clearly contrasted with the conventional way of doping (=3-dimensional doping). In this case, dopants are introduced into a reactor during growth interruption. After forming a dopant plane on GaAs surfaces, subsequent growth of undoped GaAs layer is followed. Due to the large electric field by ionized dopants, the conduction bands are significantly deformed and a V-shaped potential well is formed. Then very high density of 2-dimensional electrons can be confined in this unique potential well.

The delta-doping technique improves the characteristics of present devices. For example, when delta-doping layer is employed in an active region of a field effect transistor (FET), this delta-FET has superior characteristics as compared to a conventional FET. High source-drain saturation current ($I_{dss}$), high transconductance ($G_m$), and high reverse breakdown voltage are expected for the delta-FET.

The studies concerned with the delta-doping for GaAs epitaxial layer on GaAs substrate (homoepitaxy) have been mainly done using samples grown by molecular beam epitaxy (MBE). In that case, the growth temperatures for the delta-doped sample are typically in the range around 550° C. Significant thermal diffusion of dopants in the delta-doped sheet during post growth has been observed when the growth temperature exceeds 550° C. Thus significant degradation of delta-doping characteristics was observed.

If the same is true for MOCVD, since the nominal growth temperatures for MOCVD are in the range between 650°–750° C., the properties of MOCVD-grown delta-doped layer will be also deteriorated. However, due to a certain diffusion-limiting mechanism, we previously domonstrated the sucessful profiles of delta-doping for samples in nominal MOCVD-growth temperatures. The result for MOCVD-grown GaAs epitaxial layer on GaAs substrate was published elsewhere.

Developing this preliminary homoepitaxial research, the inventors discovered the technique of delta-doping in GaAs heteroepitazial layer grown on silicon substrate by MOCVD in the growing temperature of 700°–750° C.

SUMMARY OF THE INVENTION

Therefore, it is an object of the present invention to provide a method for an acceptable-quality delta-doping technique at 700°–750° C. in MOCVD-grown GaAs heterepitaxial layer on Si. This is realized by the suppression of accelerated diffusion of dopants in delta-doped sheet due to the environmental dislocations in the GaAs heteroepitaxial layers by employing thick buffer layer exceeding 3 μm.

BRIEF DESCRIPTION OF THE DRAWINGS

The above and other objects, features and advantages of the present invention will be apparent from the following detailed description taken in conjunction with the accompanying drawings, wherein.

DETAILED DESCRIPTION OF THE INVENTION

The detailed technique to obtain nearly ideal delta-doped layer in GaAs on Si by MCCVD is described as follows.

First, after elimination of surface oxide on (100) Si wafer titled 3 degrees toward (011) by HF dipping, the wafer is immediately loaded into a reactor. Then high temperature annealing (900°–950° C.) for 20 minutes is followed under $AsH_3 + H_2$ ambient to eliminate volatile elements on Si substrate.

After the annealing step, 2 steps for GaAs growing are followed. GaAs layer with nominal thickness of 200 Å is deposited at 450° C. by introducing TMG (trimethyl gallium) into the reactor. In this case, the grown layer has polycrystalline property. Next the substrate temperature is raised up to 700°–750° C. during this procedure (about 15–20 minutes), the polycrystalline GaAs layer is change into a single crystalline layer. At 700°–750° C., the growth of a GaAs layer is initiated.

During the growth, AsH$_3$/TMG mole ratio is typically 30, total flow rate is 5 slpm and TMG mole ratio is kept at $4 \times 10^{-5}$. With this growth parameters, typical growth rate of 3 μm/hr is obtained.

Figure 1:
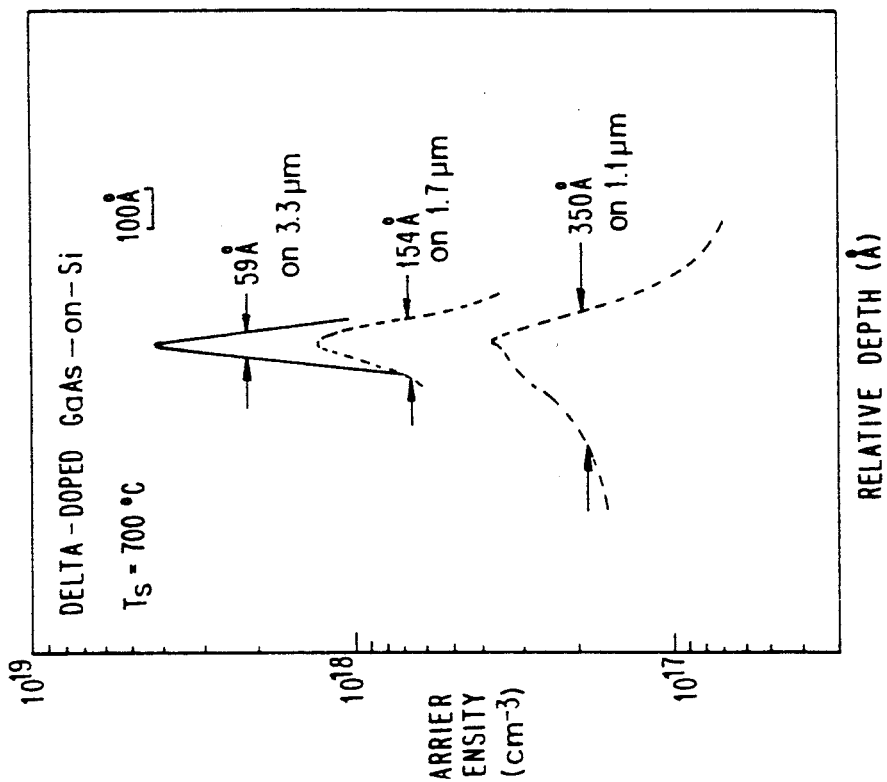
FIG. 1 is a diagram illustrating the variation of C-V profile as a function of buffer layer thickness.

After the growth of GaAs buffer layer with designed thickness, TMG is switched to vent for 12 seconds to interrupt the growth. After that, SiH$_4$ gas stream with $5 \times 10^{-7}$ mole fraction is introduced for 12 seconds. In this process, a dopant plane is formed on the GaAs surface. Then SiH$_4$ gas is switched to vent again for 12 seconds. Then subsequent GaAs capping layer is deposited with nominal thikness of 1000–3000 Å by the introduction of TMG. During this delta-doping procedure, the growth temperature is in the range of 700°–750° C. To see the feasibility of delta-doping by MOCVD, C-V profiling has been performed for 3 samples with the different buffer layer thickness. FIG. 1 shows the variation of C-V profile as a function of buffer layer thickness. The buffer layer thicknesses are 1.1, 1.7, 3.3 μm, respectively. Their growth temperatures are kept at 700° C. As can be seen in the figure, C-V FWHM (full width at half maximum) is 59 Å for a 3.3-μm-thick buffered sample. Whereas 350 Å of C-V FWHM is obtained for a 1.1 μm-thick buffered sample. The result means that delta-doping profiles are closely related to the buffer layer thickness. Many dislocations are generated from GaAs/Si heterointerface and some dislocations are thereaded to GaAs surface. As buffer layer thickness is increased, relative number of dislocations is reduced near GaAs surface. Therefore, FIG. 1 shows the correlation between delta-doping profile and environmental dislocation density. The dislocations accelerate thermal diffusion of dopants in delta-doped layer. This is due to a channel for dopant diffusion offered by dislocations.

However, it should be noted that nearly ideal delta-doping profile can be obtained when buffer layer thickness exceeds about 3 μm. 59 Å of C-V profile for 3.3 μm-thick buffered sample approaches theoretical value. Thus the result means that delta-doping even on silicon substrate having sufficient practical importance is possible as far as thick buffer layer is involved.

Figure 2:
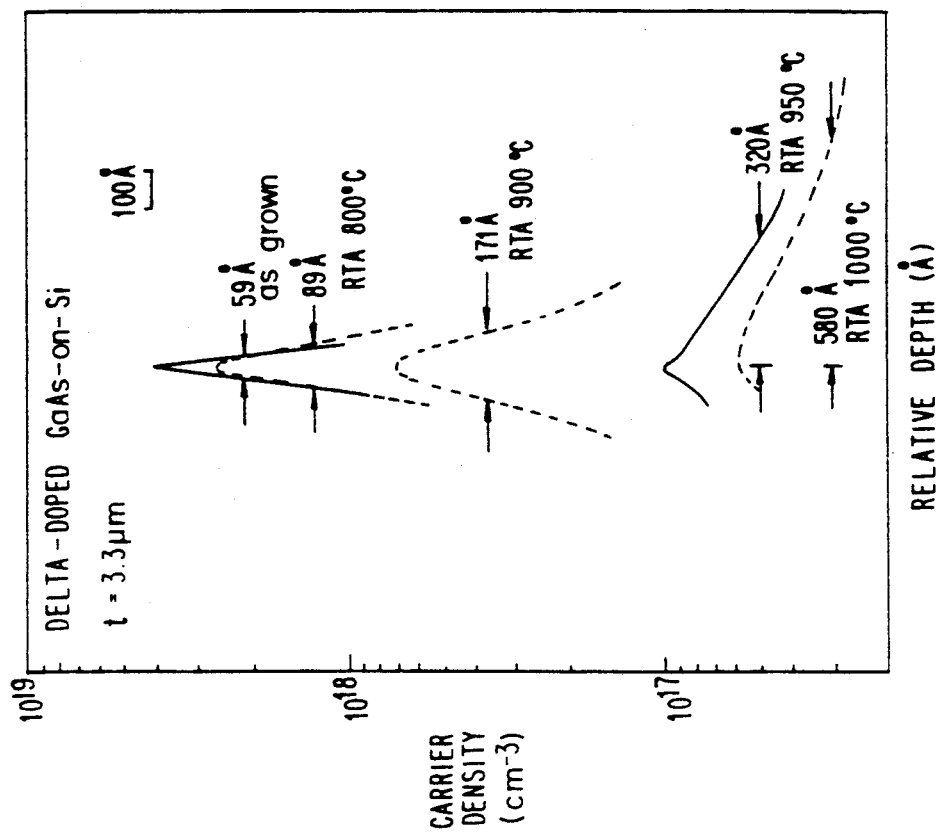
FIG. 2 is a diagram illustrating the variation of C-V profile as a function of rapid thermal annealing temperature during 7 seconds for a 3.3 μm buffered sample.
Figure 3:
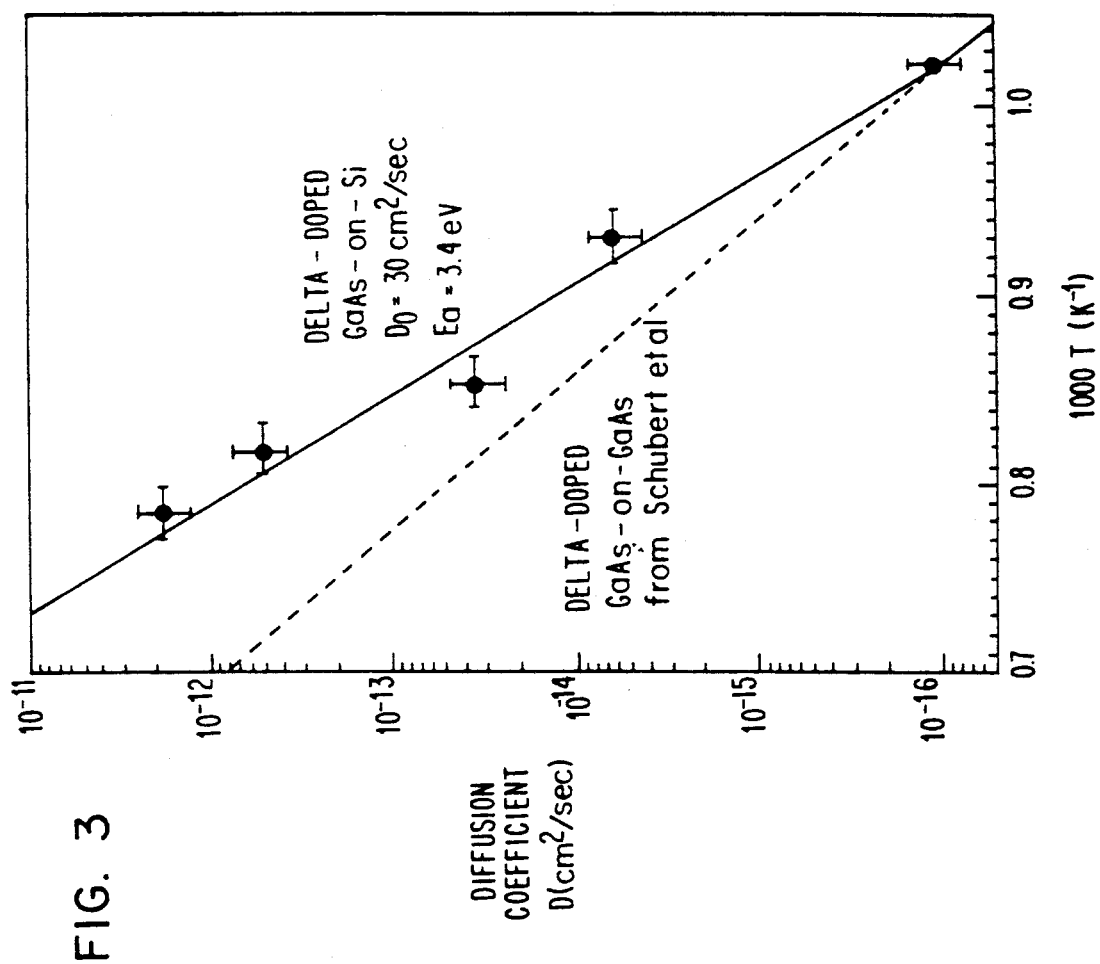
FIG. 3 is a diagram illustrating the variation of diffusion coefficient as a function of annealing temperature.

FIG. 2 shows the C-V profiling result of rapid thermal annealing experiment for 7 seconds for a sample with 3.3 μm-thick buffer layer in the temperature range of 800°–1000° C. Thus this figure shows a diffusion behavior of Si dopant in delta-layer on thermal annealing. As shown in the figure, as annealing temperatures are increasing, C-V profile widths are remarkably broadened. FIG. 3 shows the diffusion coefficients, which are obtained from C-V FWHM, varying annealing temperatures. In FIG. 3, a result from E. F. Schubert et al. for a delta-doped GaAs epitaxial layer grown on GaAs substrate for a comparison [E. F. Schubert, J. Vac. Sci. Technol. A8, 2980 (1990)], is illustrated.

In FIG. 3, it is clear that minimum required thickness of buffer layer is around 3 μm. Therefore, to obtain device-quality delta-doped GaAs epitaxial layer on Si, dislocation-accelerated diffusion should be avoided. For this reason, the inclusion of thick buffer layer exceeding 3 μm is essential.

As described above in detail, the present invention provides a method for delta-doped layer grown on silicon substrate by MOCVD at the growth temperature of 700°–750° C. For this purpose, thick buffer layer (>3 μm) whose role is preventing the dislocation-accelerated diffusion, should be included.

What is claimed is:

1. A method for delta-doping in a GaAs epitaxial layer grown on a silicon substrate by metalorganic chemical deposition, comprising the steps of:

growing a GaAs heteroepitaxial buffer layer having a thickness which exceeds 3 μm on a silicon substrate;

forming a delta-doping layer on said GaAs heteroepitaxial buffer layer by a metalorganic chemical deposition process at a temperature between 700°–750° C.; and forming an additional layer of GaAs on said delta-doping layer.

* * * * *